United States Patent
Roberts

(10) Patent No.: US 10,901,848 B2
(45) Date of Patent: Jan. 26, 2021

(54) STORAGE SYSTEMS WITH PEER DATA RECOVERY

(71) Applicant: Western Digital Technologies, Inc., San Jose, CA (US)

(72) Inventor: Adam Roberts, Moncure, NC (US)

(73) Assignee: Western Digital Technologies, Inc., San Jose, CA (US)

( * ) Notice: Subject to any disclaimer, the term of this patent is extended or adjusted under 35 U.S.C. 154(b) by 124 days.

(21) Appl. No.: 16/054,989

(22) Filed: Aug. 3, 2018

(65) Prior Publication Data

US 2020/0042390 A1 Feb. 6, 2020

(51) Int. Cl.
| | |
|---|---|
| G06F 11/00 | (2006.01) |
| G06F 11/10 | (2006.01) |
| G06F 11/14 | (2006.01) |
| G11C 29/52 | (2006.01) |
| G06F 11/20 | (2006.01) |
| G06F 16/903 | (2019.01) |
| H04L 29/08 | (2006.01) |

(52) U.S. Cl.
CPC ...... *G06F 11/1092* (2013.01); *G06F 11/1088* (2013.01); *G06F 11/1464* (2013.01); *G06F 11/2094* (2013.01); *G06F 16/903* (2019.01); *G11C 29/52* (2013.01); *H04L 67/104* (2013.01)

(58) Field of Classification Search
CPC ............ G06F 11/1076; G06F 11/1088; G06F 11/1092; G06F 11/1096; G06F 11/1464; G06F 11/2056; G06F 11/2064; G06F 16/1837
See application file for complete search history.

(56) References Cited

U.S. PATENT DOCUMENTS

| | | |
|---|---|---|
| 5,313,626 A | 5/1994 | Jones et al. |
| 5,388,083 A | 2/1995 | Assar et al. |
| 5,530,948 A | 6/1996 | Islam |
| 5,680,539 A | 10/1997 | Jones |
| 5,742,752 A | 4/1998 | DeKoning |

(Continued)

FOREIGN PATENT DOCUMENTS

| | | |
|---|---|---|
| EP | 2626780 B1 | 11/2019 |
| WO | 2014110095 A1 | 7/2014 |
| WO | 2015116197 A1 | 8/2015 |

OTHER PUBLICATIONS

A Survey of Peer-to-Peer Storage Techniques for Distributed File Systems, ITCC '05 Proceedings of the International Conference on Information Technology: Coding and Computing (ITCC'05)—vol. 2, Apr. 4, 2005, 9 pages.

(Continued)

*Primary Examiner* — Elmira Mehrmanesh
(74) *Attorney, Agent, or Firm* — Patent Law Works LLP

(57) ABSTRACT

Example peer storage systems, storage devices, and methods provide peer data recovery across a peer communication channel. Peer storage devices establish peer communication channels that communicate data among the peer storage devices. A storage device may identify storage media segments from their storage medium for recovery of failed data units. A peer storage device may be identified that contains recovery data for the failed data units. The recovery data may be received over the peer communication channel and the storage media segments may be recovered using the recovery data.

18 Claims, 5 Drawing Sheets

(56) References Cited

U.S. PATENT DOCUMENTS

| | | | |
|---|---|---|---|
| 6,092,215 A | 7/2000 | Hodges et al. | |
| 6,516,350 B1 | 2/2003 | Lumelsky et al. | |
| 6,647,514 B1 | 11/2003 | Umberger et al. | |
| 6,738,937 B1 | 5/2004 | Bergsten | |
| 7,293,133 B1 | 11/2007 | Colgrove et al. | |
| 7,434,107 B2* | 10/2008 | Marks | G06F 11/201 |
| | | | 714/4.5 |
| 7,454,655 B2* | 11/2008 | Werner | G06F 11/1482 |
| | | | 714/18 |
| 7,571,344 B2 | 8/2009 | Hughes et al. | |
| 7,620,841 B2 | 11/2009 | Chen et al. | |
| 7,680,837 B2 | 3/2010 | Yamato | |
| 7,693,847 B1 | 4/2010 | Brown et al. | |
| 7,783,600 B1 | 8/2010 | Spertus et al. | |
| 7,934,055 B2 | 4/2011 | Flynn et al. | |
| 7,984,328 B1 | 7/2011 | Coatney | |
| 8,086,911 B1 | 12/2011 | Taylor | |
| 8,289,641 B1 | 10/2012 | Emami | |
| 8,473,648 B2 | 6/2013 | Chakhaiyar et al. | |
| 8,583,853 B1 | 11/2013 | Lee et al. | |
| 8,838,931 B1 | 9/2014 | Marshak et al. | |
| 8,904,261 B2 | 12/2014 | Cideciyan et al. | |
| 9,116,624 B2 | 8/2015 | Canepa et al. | |
| 9,118,698 B1 | 8/2015 | Radovanovic | |
| 9,122,587 B2 | 9/2015 | Baryudin et al. | |
| 9,417,821 B2* | 8/2016 | Slaight | G06F 12/0866 |
| 9,448,924 B2 | 9/2016 | Sundaram et al. | |
| 9,720,601 B2 | 8/2017 | Gupta et al. | |
| 9,785,480 B2 | 10/2017 | Kamawat et al. | |
| 9,894,141 B2 | 2/2018 | Hesselink et al. | |
| 9,971,515 B2* | 5/2018 | Chang | G06F 3/0616 |
| 10,042,721 B2 | 8/2018 | Condict et al. | |
| 10,241,722 B1 | 3/2019 | Malwankar et al. | |
| 10,289,507 B1 | 5/2019 | Malwankar et al. | |
| 10,379,948 B2 | 8/2019 | O'Krafka et al. | |
| 10,394,634 B2 | 8/2019 | Reddy | |
| 10,409,769 B1 | 9/2019 | Malhotra et al. | |
| 10,474,528 B2 | 11/2019 | Bolkhovitin et al. | |
| 2001/0039575 A1 | 11/2001 | Freund et al. | |
| 2002/0162075 A1 | 10/2002 | Talagala et al. | |
| 2003/0135514 A1 | 7/2003 | Patel et al. | |
| 2003/0163649 A1 | 8/2003 | Kapur et al. | |
| 2005/0028048 A1 | 2/2005 | New et al. | |
| 2005/0080991 A1 | 4/2005 | Keohane et al. | |
| 2005/0114448 A1 | 5/2005 | Skomra | |
| 2005/0114726 A1 | 5/2005 | Ouchi | |
| 2006/0031722 A1 | 2/2006 | Kolvick et al. | |
| 2006/0123142 A1 | 6/2006 | Duncan et al. | |
| 2007/0226413 A1 | 9/2007 | Elliott et al. | |
| 2007/0245082 A1 | 10/2007 | Margolus et al. | |
| 2008/0005382 A1 | 1/2008 | Mimatsu | |
| 2008/0034153 A1 | 2/2008 | Lee et al. | |
| 2008/0250057 A1 | 10/2008 | Rothstein et al. | |
| 2009/0070539 A1 | 3/2009 | Haustein et al. | |
| 2009/0132760 A1* | 5/2009 | Flynn | G06F 3/0604 |
| | | | 711/113 |
| 2009/0150605 A1 | 6/2009 | Flynn et al. | |
| 2009/0307426 A1 | 12/2009 | Galloway et al. | |
| 2010/0011129 A1 | 1/2010 | Bita | |
| 2010/0251073 A1 | 9/2010 | Stolowitz | |
| 2010/0280998 A1 | 11/2010 | Goebel et al. | |
| 2010/0312873 A1 | 12/2010 | Loboz et al. | |
| 2011/0029711 A1 | 2/2011 | Dhuse et al. | |
| 2011/0050713 A1 | 3/2011 | McCrary et al. | |
| 2011/0055178 A1 | 3/2011 | Mark | |
| 2011/0093742 A1 | 4/2011 | Shinozaki | |
| 2012/0011200 A1 | 1/2012 | Zhang et al. | |
| 2012/0079317 A1 | 3/2012 | Nelogal et al. | |
| 2012/0179869 A1* | 7/2012 | Flynn | G06F 9/54 |
| | | | 711/114 |
| 2012/0284460 A1 | 11/2012 | Guda | |
| 2013/0073894 A1 | 3/2013 | Xavier et al. | |
| 2013/0179753 A1 | 7/2013 | Flynn et al. | |
| 2013/0339599 A1 | 12/2013 | Sundrani | |
| 2014/0012906 A1 | 1/2014 | Teja et al. | |
| 2014/0101369 A1 | 4/2014 | Tomlin et al. | |
| 2014/0164612 A1 | 6/2014 | Hillier | |
| 2014/0181041 A1 | 6/2014 | Whitehead et al. | |
| 2014/0181575 A1* | 6/2014 | Kalach | G06F 11/1415 |
| | | | 714/6.11 |
| 2014/0237298 A1 | 8/2014 | Pe'er | |
| 2014/0258598 A1 | 9/2014 | Canepa et al. | |
| 2014/0330973 A1 | 11/2014 | Freimuth et al. | |
| 2014/0365719 A1 | 12/2014 | Kuzmin et al. | |
| 2014/0379671 A1 | 12/2014 | Barrus et al. | |
| 2015/0067244 A1* | 3/2015 | Kruger | G06F 11/1458 |
| | | | 711/103 |
| 2015/0205668 A1 | 7/2015 | Sundaram et al. | |
| 2016/0070652 A1 | 3/2016 | Sundararaman et al. | |
| 2016/0092309 A1 | 3/2016 | Gao et al. | |
| 2016/0234172 A1 | 8/2016 | Agarwal et al. | |
| 2016/0335208 A1* | 11/2016 | Slaight | G06F 12/0866 |
| 2016/0342476 A1 | 11/2016 | Nazari et al. | |
| 2017/0116074 A1 | 4/2017 | Hayes et al. | |
| 2017/0242744 A1 | 8/2017 | Wang et al. | |
| 2017/0270018 A1 | 9/2017 | Xiao et al. | |
| 2017/0286237 A1 | 10/2017 | Condict et al. | |
| 2017/0329542 A1 | 11/2017 | Chou et al. | |
| 2018/0018231 A1 | 1/2018 | Okada et al. | |
| 2018/0024964 A1 | 1/2018 | Mao et al. | |
| 2018/0032446 A1 | 2/2018 | Amarendran et al. | |
| 2018/0046581 A1 | 2/2018 | Banerjee et al. | |
| 2018/0054217 A1 | 2/2018 | Schwaderer | |
| 2018/0101450 A1 | 4/2018 | Park et al. | |
| 2018/0137004 A1 | 5/2018 | Gao et al. | |
| 2018/0286210 A1 | 10/2018 | Frascati-Robinson et al. | |
| 2018/0341548 A1* | 11/2018 | Bolkhovitin | G06F 11/1068 |
| 2018/0341606 A1 | 11/2018 | Bolkhovitin et al. | |
| 2018/0357019 A1 | 12/2018 | Karr et al. | |
| 2019/0042452 A1 | 2/2019 | Clark et al. | |
| 2019/0102249 A1 | 4/2019 | Bolkhovitin et al. | |
| 2019/0102250 A1 | 4/2019 | O'Krafka et al. | |
| 2019/0243703 A1 | 8/2019 | Rooney et al. | |
| 2019/0332263 A1 | 10/2019 | Chopra et al. | |
| 2020/0026426 A1 | 1/2020 | Ma et al. | |

OTHER PUBLICATIONS

About the IBM Cloud Storage API. Sep. 28, 2018. https://console.bluemix.net/docs/services/cloud-object-storage/api-reference/about-api.html#about-the-ibm-cloud-object-storage-api.

Ahluwalia, G., United States, White Paper. Event Stream Processor as seen by SAP, An evolution of event driven architecture, pp. 1-11.

Bulk Delete. OpenStack Docs: OpenStack Security Guide, docs.openstack.org/ocata/user-guide/cli-swift-bulk-delete.html.

Donard: NVM Express for Peer-2-Peer between SSDs and other PCIe Devices, Storage Developer Conference, SNIA Santa Clara, 2015, 18 pages.

Drobo creator announces Transporter, the private cloud storage solution, May 28, 2013, <https://www.bit-tech.net/news/transporter-private-cloud-storage-drobo-cre/1/>, 2 pages.

Hightower, R., et al., Analytics with Apache Spark Tutorial Part 2: Spark SQL—DZone Big Data, Dzone.com, Nov. 3, 2015, dzone.com/articles/analytics-with-apache-spark-tutorial-part-2-spark.

International Search Report and Written Opinion of Internationals Application No. PCT/US2018/062498, dated Mar. 12, 2019, 20 pages.

Moatti, Yosef & Rom, et al., 2017, Too Big to Eat: Boosting Analytics Data Ingestion from Object Stores with Scoop, https://www.researchgate.net/.

Object Operations. Sep. 28, 2018, https://console.bluemix.net/docs/services/cloud-object-storage/api-reference/api-reference-objects.html#object-operations.

SCSI Sense Key Error Guide, Sun Microsystems, Inc., Part No. 817-5918-10, Feb. 2004, Revision A, 16 pages.

Using Oracle Cloud Infrastructure Object Storage Classic, Deleting Multiple Objects in a Single Operation, Mar. 28, 2018, https://docs.oracle.com/en/cloud/iaas/storage-cloud/cssto/deleting-multiple-objects-single-operation.html.

(56) References Cited

OTHER PUBLICATIONS

Wikipedia, The Free Encyclopedia, Key Code Qualifier, Retrieved Jul. 10, 2018, <https://en.wikipedia.org/wiki/Key_Code_Qualifier>, 8 pages.

Zhang, Jiacheng, et al., ParaFS: A Log-Structured File System to Exploit the Internal Parallelism of Flahs Devices, USENIX Annual Technical Conference, Jun. 22-24, 2016, 15 pages.

Amvrosiadis et al., Practical Scrubbing: Getting to the bad sector at the right time, 2012, IEEE, pp. 1-12 (Year: 2012).

International Search Report and Written Opinion of Application No. PCT/US2019/063104, dated Jan. 23, 2020, 11 pages.

IP.com, Peer-to-Peer Hard Disk Drive, Apr. 24, 2006, IP.com, pp. 1-3 (Year: 2006).

Xiang, Liping, et al., Optimal Recovery of Single Disk Failure in RDP Code Storage Systems, Jun. 18, 2010, http://citeseerx.ist.psu.edu/viewdoc/download?doi=10.1.1.331.4168&rep=rep1&type=pdf.

International Search Report and Written Opinion of Internationals Application No. PCT/US2019/035085, dated Sep. 18, 2019, 8 pages.

International Search Report and Written Opinion of Internationals Application No. PCT/US2019/035087, dated Sep. 25, 2019, 11 pages.

International Search Report and Written Opinion of Internationals Application No. PCT/US2019/035088, dated Sep. 26, 2019, 10 pages.

International Search Report and Written Opinion of Internationals Application No. PCT/US2019/035060, dated Sep. 16, 2019, 8 pages.

\* cited by examiner

STORAGE SYSTEMS WITH PEER DATA RECOVERY

TECHNICAL FIELD

The present disclosure generally relates to data storage systems, and in a more particular example, to data storage systems with peer-to-peer operations.

BACKGROUND

Multi-device storage systems utilize multiple discrete storage devices, generally disk drives (solid-state drives, hard disk drives, hybrid drives, tape drives, etc.) for storing large quantities of data. These multi-device storage systems are generally arranged in an array of drives interconnected by a common communication fabric and, in many cases, controlled by a storage controller, redundant array of independent disks (RAID) controller, or general controller, for coordinating storage and system activities across the array of drives. The data stored in the array may be stored according to a defined RAID level, a combination of RAID schemas, or other configurations for providing desired data redundancy, performance, and capacity utilization. In general, these data storage configurations may involve some combination of redundant copies (mirroring), data striping, and/or parity (calculation and storage), and may incorporate other data management, error correction, and data recovery processes, sometimes specific to the type of disk drives being used (e.g., solid-state drives versus hard disk drives).

Some multi-device storage systems employ storage devices capable of communicating with one another over the interconnecting fabric and/or network fabric. In some cases, these storage devices may be capable of peer-to-peer communication without the involvement of a storage control plane, such as a storage controller or host controller, as an intermediary. These peer storage devices may be capable of exchanging messages and/or transferring host data across the interconnecting fabric independent of the storage control plane. Reducing communication, data transfer, processing, and/or data management at the storage control plane may reduce bottlenecks and improve scalability as the number and capacity of storage devices increases.

Any given storage device may have limited options for recovering lost or corrupted data. In some storage arrays, a RAID controller or other storage controller may be needed for the storage device to take advantage of mirrored data, parity information, and/or other information stored on other storage devices in the storage array. In some cases, the storage device may be limited to reporting the error to the storage control plane and waiting for the storage control plane to initiate data recovery. In some cases, the only available recovery may be a complete or partial RAID rebuild of the storage device. This reliance on the storage control plane may create bottlenecks and discourage small-scale (data block, programming page, media device, etc.) data recovery based on data stored in other storage devices and this problem may only get worse as the capacity of storage devices and storage systems scales.

Therefore, there still exists a need for storage architectures that enable peer-to-peer communication for data recovery offloading from the storage control plane.

SUMMARY

Various aspects for peer operations among peer storage devices, particularly, peer data recovery are described. In an innovative aspect, a storage device comprises a processor, a memory, and an interface configured to communicate with a plurality of peer storage devices over a peer communication channel. A self-healing module is stored in the memory and executable by the processor to perform operations. A first storage media segment from the at least one storage medium is identified for recovery to a second storage media segment. The first storage media segment includes a failed data unit. At least one peer storage device identifier is identified for at least one peer storage device from the plurality of peer storage devices. The at least one peer storage device contains recovery data for the failed data unit. The recovery data for the failed data unit is received from the at least one peer storage device over the peer communication channel. The first storage media segment is recovered to the second storage media segment using the recovery data.

In various embodiments, the peer communication channel may bypass a storage control plane for managing the storage device. A device error detector may be stored in the memory and executable by the processor to perform operations comprising detecting an unrecoverable error in the failed data unit stored on the at least one storage medium and initiating the self-healing module to identify the first storage media segment that includes the failed data unit in response to detecting the unrecoverable error. The device error detector may be further executable by the processor to perform operations comprising detecting a failing media location from the at least one storage medium in response to exceeding an endurance threshold for the failing media location and initiating the self-healing module to identify the first storage media segment. The first storage media segment may include the failing media location and the failing media location may include the failed data unit. The device error detector may be further executable by the processor to perform operations comprising identifying a storage media device from the at least one storage medium and executing a media scan of the storage media device to detect errors in the plurality of data units. The storage media device may include the plurality of data units, the plurality of data units may include the failed data unit, and the first storage media segment may include the storage media device. The device error detector may be further executable by the processor to perform operations comprising identifying a logical data group from the at least one storage medium, wherein the logical data group includes a plurality of data units and executing a media scan of the logical data group to detect errors in the plurality of data units. The plurality of data units may include the failed data unit.

In some embodiments, the at least one peer storage device may include a peer parity storage device and the recovery data may include a parity data set for the failed data unit. Recovering the first storage media segment may include using the parity data set to calculate the failed data unit using an erasure coding engine. The at least one peer storage device may include a peer mirror storage device and the recovery data may include a duplicate data set for the failed data unit. Recovering the first storage media segment may include using the duplicate data set to write the failed data unit to the second storage media segment.

In some embodiments, the self-healing module may be further executable by the processor to perform operations comprising sending a peer query to the at least one peer storage device over the peer communication channel using the at least one peer storage device identifier. Receiving the recovery data for the failed data unit may be in response to the peer query. The second storage media segment may be in a peer offload storage device selected from the plurality of peer storage devices. Recovering the first storage media segment to the second storage media segment may include a peer data transfer to the peer offload storage device over the peer communication channel.

In another innovative aspect, a computer-implemented method for execution by a storage device provides a peer data recovery. Storage device identifiers are stored for a plurality of peer storage devices in a first storage device. A peer communication channel is established with at least one of the plurality of peer storage devices from the first storage device. The peer communication channel bypasses a storage control plane for managing the first storage device. A first storage media segment is identified in the first storage device for recovery to a second storage media segment. The first storage media segment includes a failed data unit. At least one peer storage device identifier is identified for at least one peer storage device from the plurality of peer storage devices. The at least one peer storage device contains recovery data for the failed data unit and is not the first storage device. The recovery data for the failed data unit is received from the at least one peer storage device over the peer communication channel. The first storage media segment is recovered to the second storage media segment using the recovery data.

In various embodiments, an unrecoverable error may be detected in the failed data unit stored in the first storage device. Identifying the first storage media segment may be in response to detecting the unrecoverable error. Detecting a failing media location in the first storage device may be in response to exceeding an endurance threshold for the failing media location. The first storage media segment may be identified in response to detecting the failing media location. The first storage media segment may include the failing media location and the failing media location may include the failed data unit.

In some embodiments, media scan of a storage media device in the first storage device may be executed to detect at least one media error. The storage media device may include a plurality of data units. The plurality of data units may include the failed data unit. The at least one media error may relate to the failed data unit. The first storage media segment may include the storage media device. Identifying the first storage media segment may be in response to detecting the at least one media error in the media scan. A media scan of a logical data group in the first storage device may be executed to detect at least one media error in at least one logical data unit. The logical data group may include a plurality of logical data units, the plurality of logical data units may include the failed data unit, and the at least one media error relates to the failed data unit. Identifying the first storage media segment may be in response to detecting the at least one media error in the media scan.

In some embodiments, the at least one peer storage device may include a peer mirror storage device and the recovery data may include a duplicate data set for the failed data unit. Recovering the first storage media segment may include using the duplicate data set to write the failed data unit to the second storage media segment. A peer query may be sent to the at least one peer storage device over the peer communication channel using the at least one peer storage device identifier. Receiving the recovery data for the failed data unit may be in response to the peer query.

In yet another innovative aspect, a storage system comprises a plurality of peer storage devices and each storage device comprises at least one storage medium and various means. Means are provided for storing storage device identifiers for the plurality of peer storage devices. Means are provided for establishing a peer communication channel between two of the plurality of peer storage devices. The peer communication channel bypasses a storage control plane for managing the plurality of peer storage devices. Means are provided for identifying a first storage media segment in the at least one storage medium for recovery to a second storage media segment. The first storage media segment includes a failed data unit. Means are provided for identifying at least one peer storage device identifier for at least one recovery peer storage device from the plurality of peer storage devices. The at least one recovery peer storage device contains recovery data for the failed data unit. Means are provided for receiving the recovery data for the failed data unit from the at least one recovery peer storage device over the peer communication channel. Means are provided for recovering the first storage media segment to the second storage media segment using the recovery data.

In various embodiments, means may be provided for detecting an unrecoverable error in the failed data unit stored in the at least one storage medium, wherein identifying the first storage media segment is in response to detecting the unrecoverable error.

The various embodiments advantageously apply the teachings of multi-device peer storage systems to improve the functionality of such computer systems. The various embodiments include operations to overcome or at least reduce the issues in the previous storage systems discussed above and, accordingly, are more reliable and scalable than other computer data storage architectures for some applications. That is, the various embodiments disclosed herein include hardware and/or software with functionality to improve the reliability and scalability of peer-to-peer data recovery operations, based on enabling peer-to-peer data recovery with limited involvement of the storage control plane. Accordingly, the embodiments disclosed herein provide various improvements to storage systems.

It should be understood that language used in the present disclosure has been principally selected for readability and instructional purposes, and not to limit the scope of the subject matter disclosed herein.

DETAILED DESCRIPTION

Figure 1:
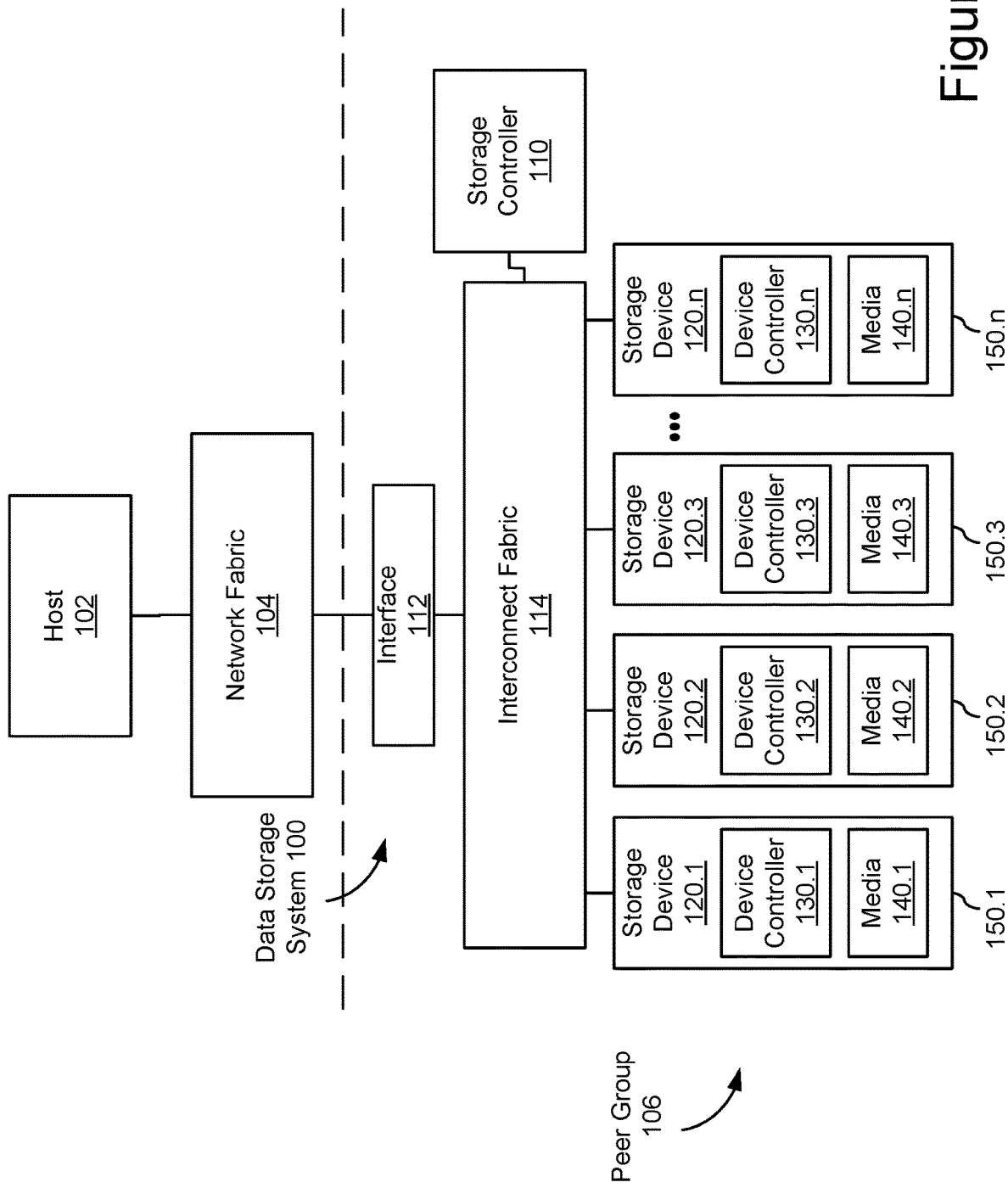
FIG. 1 schematically illustrates an example of a peer storage system.

FIG. 1 shows an embodiment of an example data storage system 100 with peer communicating data storage devices 120. While some example features are illustrated, various other features have not been illustrated for the sake of brevity and so as not to obscure pertinent aspects of the example embodiments disclosed herein. To that end, as a non-limiting example, data storage system 100 includes one or more data storage devices 120 (also sometimes called information storage devices, storage devices, or disk drives) configured in a peer group 106.

In the embodiment shown, peer group 106 includes a number of storage devices 120 attached to a common interconnect fabric 114. For example, peer group 106 may include a number of disk drives arranged in a storage array, such as storage devices sharing a common rack or unit in a data center. In some embodiments, peer group 106 may share back plane connectivity, network switch(es), and/or other hardware and software components related to interconnect fabric 114. In some embodiments, peer groups may not be collocated in the same unit, rack, data center, or geography. For example, interconnect fabric 114, network interface 112, and network fabric 104 may enable peer-to-peer communication among storage devices over any distance and peer bonds may be established regardless (or even because of) different geographic locations, data centers, administrators, and organizations. In some embodiments, peer group 106 may be defined by peer bonds that enable peer-to-peer communication without the intervention of related storage control planes.

In some embodiments, the data storage devices 120 are, or include, solid-state drives (SSDs). Each data storage device 120.1-120.$n$ may include a non-volatile memory (NVM) or device controller 130 based on compute resources (processor and memory) and a plurality of NVM or media devices 140 for data storage (e.g., one or more NVM device(s), such as one or more flash memory devices). In some embodiments, a respective data storage device 120 of the one or more data storage devices includes one or more NVM controllers, such as flash controllers or channel controllers (e.g., for storage devices having NVM devices in multiple memory channels). In some embodiments, data storage devices 120 may each be packaged in a housing 150, such as a multi-part sealed housing with a defined form factor and ports and/or connectors for interconnecting with interconnect fabric 114.

In some embodiments, a respective data storage device 120 may include a single medium device 140 while in other embodiments the respective data storage device 120 includes a plurality of media devices. In some embodiments, media devices include NAND-type flash memory or NOR-type flash memory. In some embodiments, data storage device 120 includes one or more hard disk drives (HDDs). In some embodiments, data storage devices 120 may include a flash memory device, which in turn includes one or more flash memory die, one or more flash memory packages, one or more flash memory channels or the like. However, in some embodiments, one or more of the data storage devices 120 may have other types of non-volatile data storage media (e.g., phase-change random access memory (PCRAM), resistive random access memory (ReRAM), spin-transfer torque random access memory (STT-RAM), magneto-resistive random access memory (MRAM), etc.).

Storage controller 110 is coupled to data storage devices 120.1-120.$n$ through interconnect fabric 114. However, in some embodiments, storage controller 110 may be hosted as a component and/or a subsystem of another component of data storage system 100. For example, in some embodiments, some or all of the functionality of storage controller 110 may be implemented by software executed on one or more compute resources in at least one of data storage devices 120.1-120.$n$, interconnect fabric 114, or interface 112. Storage controller 110 is sometimes called a controller system, a main controller system, a non-volatile memory express (NVMe) controller, garbage collection (GC) leader, or storage virtualization controller (SVC). In some embodiments, a device controller 130.1 associated with a particular storage device (e.g., 120.1) acts as storage controller 110 for other storage devices (e.g., 120-2, 120-3, and 120.$n$) in data storage system 100. In some embodiments, storage controller 110 is a component and/or subsystem of host 102 (described below).

In some embodiments, host 102 is coupled to data storage system 100 through network interface 112 over a network fabric 104. In some embodiments, multiple hosts 102 (only one of which is shown in FIG. 1) are coupled to data storage system 100 through network interface 112, which may be a storage network interface or other interface capable of supporting communications with multiple hosts 102. Network fabric 104 may include a wired and/or wireless network (e.g., public and/or private computer networks in any number and/or configuration) which may be coupled in a suitable way for transferring data. For example, network fabric 104 may include any means of a conventional data communication network such as a local area network (LAN), a wide area network (WAN), a telephone network, such as the public switched telephone network (PSTN), an intranet, the internet, or any other suitable communication network or combination of communication networks.

Host 102, or a respective host in a system having multiple hosts, may be any suitable computer device, such as a computer, a laptop computer, a tablet device, a netbook, an internet kiosk, a personal digital assistant, a mobile phone, a smart phone, a gaming device, a computer server, or any other computing device. Host 102 is sometimes called a host system, client, or client system. In some embodiments, host 102 is a server system, such as a server system in a data center. In some embodiments, the one or more hosts 102 are one or more host devices distinct from storage controller 110 and distinct from the plurality of storage devices 120; but in some other embodiments, the one or more hosts 102 include one of the storage devices 120 that has been configured to perform data processing operations and to send data storage commands to access data stored in the one or more storage devices 120. In some other embodiments, the one or more hosts 102 are configured to store and access data in the plurality of storage devices 120.

In some embodiments, data storage system 100 includes one or more processors, one or more types of memory, a display and/or other user interface components such as a keyboard, a touch screen display, a mouse, a track-pad, and/or any number of supplemental devices to add functionality. In some embodiments, data storage system 100 does not have a display and other user interface components.

The one or more device controllers 130, if included in a respective storage device 120, are coupled with storage controller 110 through interconnect fabric 114. Interconnect fabric 114 is sometimes called a data connection, but typically convey commands in addition to data, and optionally convey metadata, error correction information and/or other information in addition to data values to be stored in media devices 140 and data values read from media devices 140.

In some embodiments, however, storage controller 110, the one or more device controllers 130, and media devices 140 are included in the same device (i.e., an integrated device) as components thereof. Furthermore, in some embodiments, one or more of the storage devices 120 (e.g., including storage controller 110, the one or more device controllers 130, and media devices 140) are embedded in a host device (e.g., host 102), such as a mobile device, tablet, other computer or computer-controlled device, and the methods described herein are performed, at least in part, by the embedded storage controller. In some embodiments, device controllers 130 are configured to both control one or more media devices 140 and provide distributed storage controller functions in conjunction with storage controller 110.

In some embodiments, storage devices 120 include a plurality of media devices 140, such as flash memory devices, and optionally includes fewer device controllers 130. Viewed another way, in some embodiments, a storage device 120 includes multiple memory channels, each of which has a device controller 130 and a set of media devices 140 coupled to the device controller 130. However, in some embodiments, two or more memory channels share a device controller 130. In either example, each memory channel has its own distinct set of media devices 140. In a non-limiting example, the number of memory channels in a typical storage device is 8, 16, or 32. In another non-limiting example, the number of media devices 140 per memory channel is typically 8, 16, 32, or 64. Furthermore, in some embodiments, the number of media devices 140 in one memory channel is different from the number of media devices in another one of the memory channels.

In some embodiments, each device controller of device controllers 130 includes one or more processing units (also sometimes called CPUs or processors or microprocessors or microcontrollers) configured to execute instructions in one or more programs (e.g., in device controllers 130). In some embodiments, the one or more processors are shared by one or more components within, and in some cases, beyond the function of device controllers 130. As noted above, media devices 140 are coupled to device controllers 130 through connections that typically convey commands in addition to data, and optionally convey metadata, error correction information and/or other information in addition to data values to be stored in media devices 140 and data values read from media devices 140. Media devices 140 may include any number (i.e., one or more) of memory devices including, without limitation, non-volatile semiconductor memory devices, such as flash memory device(s).

Flash memory device(s) (e.g., media devices 140) can be configured for enterprise storage suitable for applications such as cloud computing, for database applications, primary and/or secondary storage, or for caching data stored (or to be stored) in secondary storage, such as hard disk drives. Additionally, and/or alternatively, flash memory device(s) (e.g., media devices 140) can also be configured for relatively smaller-scale applications such as personal flash drives or hard-disk replacements for personal, laptop, and tablet computers. Although flash memory devices and flash controllers are used as an example here, in some embodiments storage device(s) 120 include other non-volatile memory device(s) and corresponding non-volatile storage controller(s).

In some embodiments, media devices 140 are divided into a number of addressable and individually selectable blocks, sometimes called erase blocks. In some embodiments, individually selectable blocks are the minimum size erasable units in a flash memory device. In other words, each block contains the minimum number of memory cells that can be erased simultaneously (i.e., in a single erase operation). Each block is usually further divided into a plurality of pages and/or word lines, where each page or word line is typically an instance of the smallest individually accessible (readable) portion in a block. In some embodiments (e.g., using some types of flash memory), the smallest individually accessible unit of a data set, however, is a sector or codeword, which is a subunit of a page. That is, a block includes a plurality of pages, each page contains a plurality of sectors or codewords, and each sector or codeword is the minimum unit of data for reading data from the flash memory device.

A data unit may describe any size allocation of data, such as host block, data object, sector, page, multi-plane page, erase/programming block, media device/package, etc. Storage locations may include physical and/or logical locations on media devices 140 and may be described and/or allocated at different levels of granularity depending on the storage medium, storage device/system configuration, and/or context. For example, storage locations may be allocated at a host logical block address (LBA) data unit size and addressability for host read/write purposes but managed as pages with storage device addressing managed in the media flash translation layer (FTL) in other contexts. Media segments may include physical storage locations on media devices 140, which may also correspond to one or more logical storage locations. In some embodiments, media segments may include a continuous series of physical storage location, such as adjacent data units on a storage medium, and, for flash memory devices, may correspond to one or more media erase or programming blocks. A logical data group may include a plurality of logical data units that may be grouped on a logical basis, regardless of storage location, such as data objects, files, or other logical data constructs composed of multiple host blocks.

Figure 2:
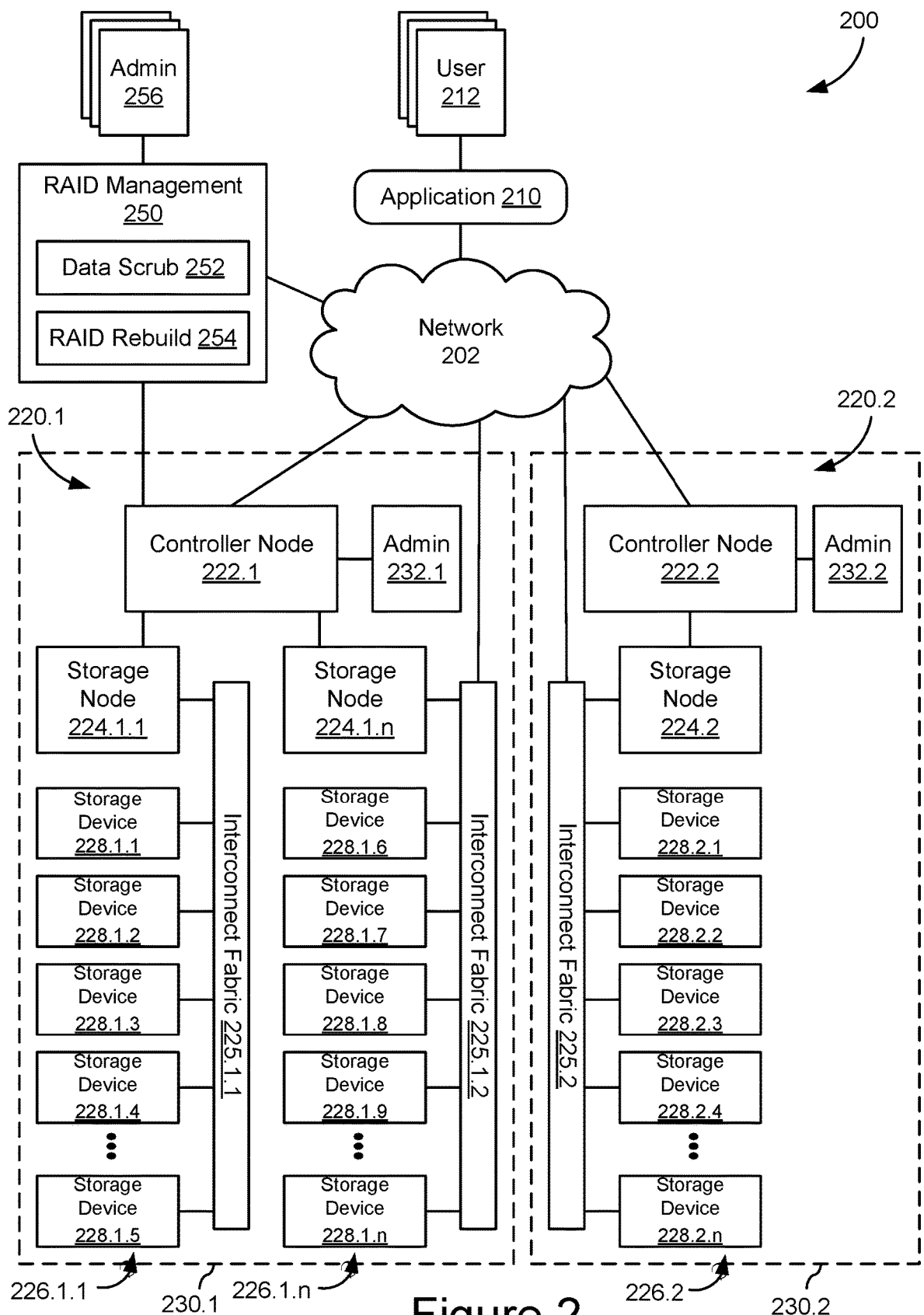
FIG. 2 schematically illustrates an example storage control plane configuration for one or more peer storage systems.

FIG. 2 shows an embodiment of an example storage system 200, such as a global storage system implementing multiple distributed storage systems 230 in different locations 220. Storage system 200 may be implemented as a plurality of distributed storage systems 230 which is coupled to an application 210 for accessing, storing, and using data stored in storage system 200. Storage system 200 may include a plurality of storage devices 228 configured as components of the disaggregated storage systems and some or all of these storage devices 228 may be configured for peer communication and allocated in one or more peer groups. In some embodiments, these peer groups may include storage devices at different physical locations 220 with different administrators 232. Additional remote administrators 256 may have various responsibilities for storage system 200 and use a network-based RAID management system 250 to configure, monitor, and control data recovery across storage system 200.

The connection between storage system 200 and application 210 could, for example, be implemented as a suitable data communication network 202, such as a LAN, WAN, internet, etc. Application 210 could, for example, be a dedicated software application running on a computing device, such as a personal computer, a laptop, a wireless telephone, a personal digital assistant or any other type of communication device that is able to interface with the storage system 200. In some embodiments, application 210 could, for example, comprise a suitable file system which enables a general purpose software application to interface with storage system 200, an application programming interface (API) library for the storage system 200, etc. In some embodiments, application 210 may be a user application, such as business or personal application instantiated in a local, client/server, web, and/or mobile application that enables users 212 to interact with data stored in storage system 200.

As further shown in FIG. 2, storage system 200 comprises two storage locations 220 implementing disaggregated storage architectures. Each storage location 220 may include a controller node 222 and one or more storage nodes 224 which may be coupled in a suitable way for transferring data, for example by means of interconnect fabrics 225.

Each of storage nodes 224 may further connect to a plurality of storage devices 228 arranged in storage arrays 226. Controller nodes 222, storage nodes 224, and storage devices 228 may connect to the data communication network 204 and each other by means of suitable wired, wireless, optical, etc. network connections or any suitable combination of such network connections.

Although the example of Figures shows only two controller nodes 222, three storage nodes 224, three storage arrays 226, and fifteen storage devices 228, storage system 200 could comprise any other suitable number of controller nodes 222, storage nodes 224, and storage devices 228 arranged in any number of storage arrays 226. As shown in FIG. 1, each storage array 226 may be configured as a peer group. In some embodiments, peer groups may not include every storage device in a storage array and/or peer groups may include storage devices from different arrays and/or different locations. Any number of storage devices 228 may be configured for one or more peer groups and, in some embodiments, storage devices 228 may participate in multiple peer groups at the same time.

Controller nodes 222 and storage nodes 224 can be built as general-purpose computers, however more frequently they are physically adapted for arrangement in large data centers, where they are arranged in modular racks comprising standard dimensions. Exemplary controller nodes 222 and storage nodes 224 may be dimensioned to take up a single unit of such rack, which is generally referred to as 1U. Such an exemplary storage node 224 may use a low-power processor and may be equipped with ten or twelve high capacity serial advanced technology attachment (SATA) storage devices 228 (even though only five storage devices 228 are shown for each storage node 224) and is connectable to the network over redundant Ethernet network interfaces. In some embodiments, storage nodes 224 may include a compute complex providing storage controller or other storage-related functionality.

An exemplary controller node 222 may comprise high-performance servers and provide network access to applications 210 over multiple high bandwidth Ethernet network interfaces. Data can be transferred between applications 210 and such a controller node 222 by means of a variety of network protocols including hypertext transfer protocol (HTTP)/representational state transfer (REST) object interfaces, language-specific interfaces such as Microsoft .Net, Python or C, etc. Additionally, such controller nodes may comprise additional high bandwidth Ethernet ports to interface with the storage nodes 224. In some embodiments, HTTP/REST protocols complying with S3 may enable data transfer through a REST application protocol interfaces (API). Preferably, such controller nodes 222 operate as a highly available cluster of host nodes, and provide for example shared access to the storage nodes 224, metadata caching, protection of metadata, etc.

Several storage nodes 224 can be grouped together, for example because they are housed in a single rack or a single physical location 220.1. For example, storage nodes 224.1.1 to 224.1.n may be grouped in physical location 220.1 and support host node 202.1, while storage node 224.2 may be located in physical location 220.2 and support host node 202.2. These physical locations 220 are not required to be located at the same geographic location, they are often geographically dispersed across different data centers. For example, physical location 220.1 can be located at a data center in Europe and physical location 220.2 at a data center in China. A peer group may communicate between physical locations 220 and may engage in peer-to-peer data operations, such as data offloading or rebuild from RAID or mirrored data, across physical locations 220 through network 202. In some embodiments, administrator 232.1 in location 220.1 and administrator 232.2 in location 220.2 may not control when peer data operations occur between storage devices 228.

Controller nodes 222, storage nodes 224, and/or host systems for application 210 and/or RAID management system 250, may provide a storage control plane for storage devices 228. In some embodiments, the storage control plane may include any system components that provide host read/write, RAID management, and/or storage array or storage system level data management commands that are not themselves peer storage devices. For example, the storage control plane may include a combination of storage controllers, host controllers, RAID controllers, and similar systems. The storage control plane may be distinguishable (in terms of function) from interconnect and network fabric systems that are responsible for providing physical and data layer communication between system components, which may include addressing and routing of data frames. In some embodiments, the same hardware may participate in the storage control plane and the interconnect and/or network fabric, but the storage control plane functions relate to originating and/or translating media storage related commands (session, presentation, and/or application layer activities) and are distinguishable from networking functions (physical, data link, and network layer activities). In some embodiments, peer storage devices may provide storage control commands to one another, but they are not part of the storage control plane.

In some embodiments, RAID management system 250 may be configured as an application or module in an information technology (IT) management system running on a general-purpose computer, such as such as a personal computer, a laptop, a tablet, a wireless telephone, a personal digital assistant or any other type of communication device that is able to interface with the storage system 200 and/or operational data about storage system 200 over network 202. For example, RAID management system 250 may provide a dashboard for system maps, configuration information, operating data, system/component diagnostics, performance metrics, and/or status information for storage devices 228, storage arrays 226, storage nodes 224, controller nodes 222, etc. In some embodiments, RAID management system 250 may include RAID configurations, rebuild status, backup/archive configurations, storage device endurance and lifecycle management, and/or peer group configurations. RAID management system 250 may support a number of administrators 256 with varying IT management responsibilities, including provisioning, maintenance, data management, equipment management, and related scheduling, costing, and project management.

In some embodiments, RAID management system 250 may include a data scrub module 252 and a RAID rebuild module 254. Data scrub module 252 may include logic and data structures for managing systematic data scrub of storage devices 228 to identify storage locations that have become unreadable, unwritable, and/or error prone. For example, data scrub module 252 may coordinate systematic data reads to pages or sectors in storage devices 228 by issuing individual reads and collecting completion and/or error data and/or initiating a data scrub routine at the storage device on specified storage locations. In some embodiments, data collected by data scrub module 252 may be combined with endurance or performance data to proactively manage data risk and end of life of storage devices 228 and/or media devices therein. In some embodiments, data scrub results may also support RAID stripe allocation and/or mirroring decisions by RAID management system 250. If a threshold of failed reads are passed during data scrub, a storage device 228 or a portion thereof may be identified as a failed drive and initiate a complete or partial RAID rebuild to replace the failed storage device.

RAID rebuild module 254 may respond to a failed storage device among storage devices 228, results of data scrub module 252 identifying a failed or failing storage device, endurance or end-of-life modelling that predicts storage device failure, and/or maintenance decisions of administrators 256. In some embodiments, RAID rebuild module 254 may identify a failed storage device to rebuild and a replacement storage device to which the data from the failed storage device is to be rebuilt based on RAID configuration and the available RAID recovery data in storage devices 228. For example, one or more of storage devices 228 may include mirrored data or participate in a RAID stripe for the XORed and/or parity data for recovering the data from the failed storage device. In some embodiments, RAID rebuild module 254 may be configured for partial rebuilds of less than full storage device replacement and/or partial recovery from the failed storage device (rather than relying solely on recovery data).

In some embodiments, some or all functions of RAID management system 250 may be offloaded to or integrated into other components of storage system 200. For example, RAID management 250 may be integrated into controller nodes 222 and/or storage nodes 224. In some embodiments, one or more functions may be wholly or partially offloaded to storage devices 228. For example, storage devices 228 may be configured for self-data scrubbing, with or without coordination by data scrub module 252. In some embodiments, storage devices 228 may be configured for offloaded RAID management, which may include allocation of RAID stripes and/or data mirroring and/or rebuild of failed storage devices, with or without coordination by RAID rebuild module 254. In some embodiments, storage devices 228 may be configured for data recovery based on RAID configuration and/or RAID recovery data from peer storage devices for selective storage location and partial RAID rebuilds. In some embodiments, these offloaded RAID management services from RAID management system 250 may be configured as offloaded services in storage devices 228.

Figure 3:
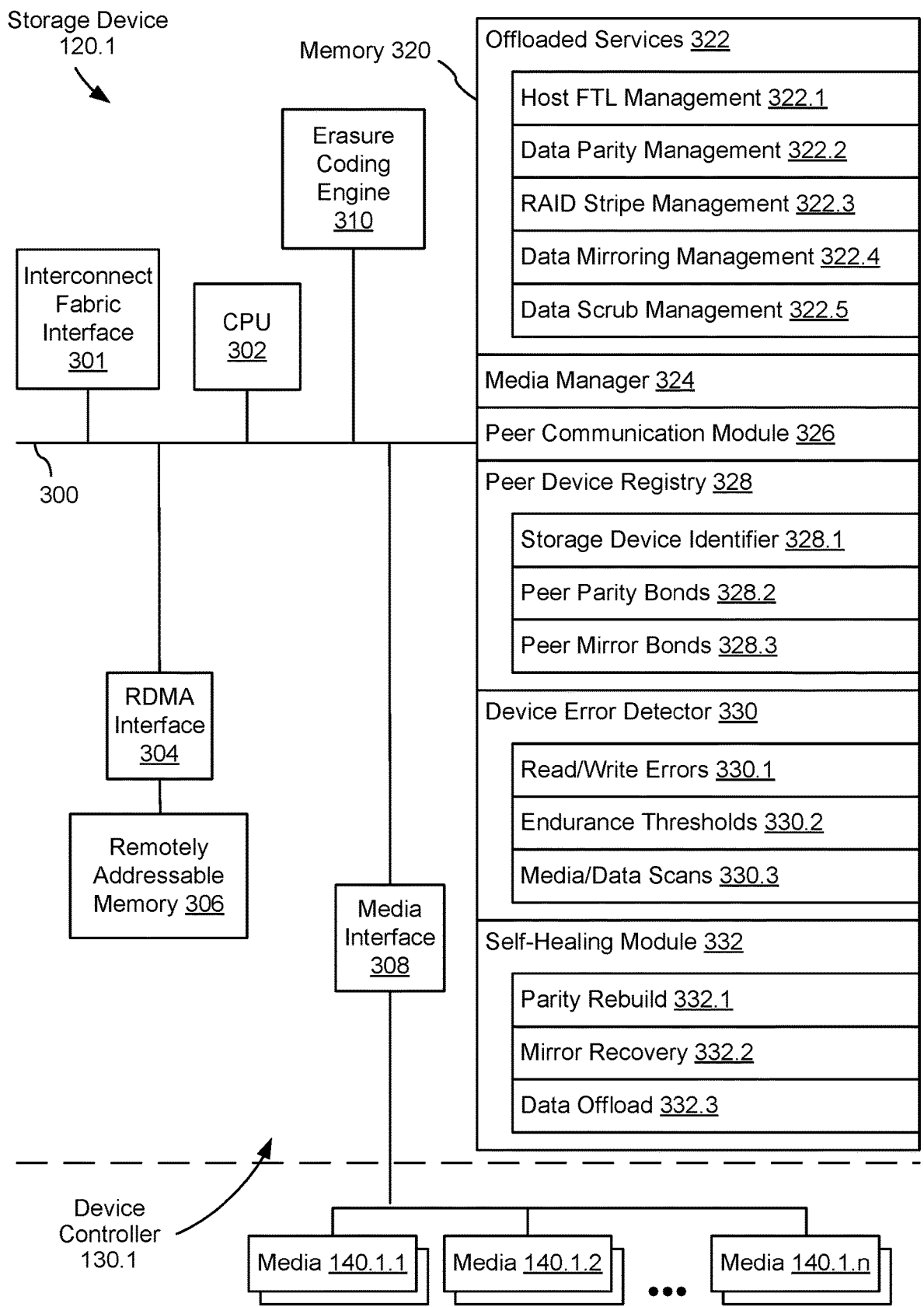
FIG. 3 schematically illustrates an example of a storage device of the peer storage system of FIG. 1.

In some embodiments, as shown in FIG. 3, a storage device 120.1 includes the functions of a device controller 130.1 with peer communication capabilities using compute resources, such as one or more processing units (CPUs 302), sometimes herein called CPU, processors, or hardware processors, and sometimes implemented using microprocessors, microcontrollers, or the like, configured to execute instructions in one or more programs (e.g., the modules in memory 320). In some embodiments, the one or more CPUs 302 are shared by one or more components within, and in some cases, beyond the function of storage device 120. The modules in memory 320 and executed by CPU 302 may be coupled to interconnect fabric interface 301, RDMA interface 304, media interface 308, erasure coding engine 310, and any number of additional modules, such as error correction engines, specialized memory modules, etc., in order to coordinate the operation of these components. In some embodiments, the components of storage device 120.1 may be interconnected by one or more communication buses 300. In some embodiments, CPU 302, memory 320, media interface 308, erasure coding engine 310, and any number of additional modules may be packaged as a device controller 130.1, such as an NVM controller, implemented in an application-specific integrated circuit (ASIC), system on a chip (SoC), field programmable gate array (FPGA), or similar architecture.

In some embodiments, storage device 120.1 may be packaged in a housing (not shown in FIG. 3, but see housing 150.1 in FIG. 1), such as a sealed, multipart disk drive housing. For example, device controller 130.1 and media devices 140.1 may be enclosed in the housing. In some embodiments, the housing may have an exterior surface surrounding the internal components, with one or more connectors projecting from or interface ports recessed into the exterior surface. For example, these connectors and/or interface ports may provide physical interconnects for power to and communication with storage device 120.1.

Storage device 120.1 may include a variety of local memory resources and local compute resources. In some embodiments, local resources may include components that are integrated into storage device 120.1 and may scale with the number of storage devices. Example local memory resources may include memory 320 (e.g. the operating memory of media controller 130.1), remotely addressable memory 306 (e.g. remotely addressable memory available through a remotely addressable interface), and other specialized memory (not shown). In some embodiments, storage media, such as media devices 140, may provide local memory resources for data management functions, but these may be distinct from storage locations for host data. Example local compute resources may include CPU 302 (e.g. the operating processor of device controller 130.1), erasure coding engines, error correction engines, and any other specialized processing systems. In some embodiments, one or more interfaces, such as interconnect fabric interface 301 or RDMA interface 304, may also include or utilize memory and/or compute resources and may be part of the available local resources of storage device 120.1.

In some embodiments, RDMA interface 304 may be a hardware, software, or combined hardware/software engine for providing remote data management access to remotely addressable memory 306. This may include local direct memory access (DMA) to remotely addressable memory 306 for CPU 302 or other components of device controller 130.1. The RDMA engines of RDMA interface 304 may allow storage device 120.1 to push or pull data from/to remotely addressable memory 306 and to/from memory locations in other storage devices, storage controllers (e.g. storage controller 110), or servers (e.g. host 102).

In some embodiments, erasure coding engine 310 may be a hardware, software, or combined hardware/software engine for providing exclusive-or calculations or implementing another erasure coding operation. Erasure coding engine 310 may support multiple functions stored in memory 320 and/or support XOR or other erasure code processing of data being transferred to or from remotely addressable memory 306, with or without RDMA interface 304. In some embodiments, erasure coding engine 310 may be used to process recovery data, such as paired XOR data and parity data, to calculate the data content of a failed or corrupted data unit.

Additional modules (not shown) supporting one or more functions of storage device 120 may be connected to CPU 302, RDMA interface 304, media interface 308, erasure coding engine 310, and memory 320. In some embodiments, additional module(s) are executed in software by the CPU 302; in other embodiments, additional module(s) are implemented in whole or in part using special purpose circuitry (e.g., to perform encoding and decoding functions).

In some embodiments, during a write operation initiated by a host 102, storage controller 110 receives a host write command (e.g., in a set of one or more host write commands) via interface 112 (FIG. 1), translates that host command into a write command, sometimes called a translated command or translated write command, suitable for execution by a data storage device 120, and sends the translated host data command to one or more data storage devices corresponding to one more addresses specified by the host write command, a destination storage device.

In some storage systems, a storage controller also receives, via interface 112, data to be stored in the one or more data storage devices corresponding to the one more addresses specified by the host write command. A respective data storage device receives the data to be stored in its media devices 140.1.1-140.1.n, or a portion of the data to be stored, from the storage controller via the interconnect fabric 114. The data received by the storage device may be encoded or otherwise processed and made available to storage media interface 308, which transfers the data to media devices 140.1 in a manner dependent on the type of storage medium being utilized. In storage device 120, RDMA interface 304 and remotely addressable memory 306, sometimes in conjunction with coordination from storage controller 110, may allow host 102 to send the data to be stored in the host write command to remotely addressable memory 306 in storage device 120 without them passing through storage controller 110 or another storage controller.

In some embodiments, a storage media (e.g., media devices 140.1) is divided into a number of addressable and individually selectable blocks and each block is optionally (but typically) further divided into a plurality of pages and/or word lines and/or sectors, storage locations of defined storage unit sizes. While erasure of data from a storage medium is performed on a block basis, in many embodiments, reading and programming of the storage medium is performed on a smaller subunit of a block (e.g., on a page basis, word line basis, or sector basis).

In some embodiments, the smaller subunit of a block consists of multiple memory cells (e.g., single-level cells or multi-level cells). In some embodiments, programming is performed on an entire page. In some embodiments, a multi-level cell (MLC) NAND flash typically has four possible states per cell, yielding two bits of information per cell. Further, in some embodiments, a MLC NAND has two page types: (1) a lower page (sometimes called the fast page), and (2) an upper page (sometimes called the slow page). In some embodiments, a triple-level cell (TLC) NAND flash has eight possible states per cell, yielding three bits of information per cell. Although the description herein uses TLC, MLC, and SLC as examples, those skilled in the art will appreciate that the embodiments described herein may be extended to memory cells that have more than eight possible states per cell, yielding more than three bits of information per cell. In some embodiments, the encoding format of the storage media (i.e., TLC, MLC, or SLC and/or a chosen data redundancy mechanism or ECC code) is a choice made when data is actually written to the storage media.

In addition, these various memory cell configurations and encoding formats may impact the lifetime performance of storage device 120.1. Flash memory may have defined I/O performance, endurance, write voltage thresholds, error rates, cell/device failures, and other parameters that may be tracked for specific performance values and/or contributions to storage capacity, performance class, endurance, and/or overall health. Similarly, cell usage, read and write load balancing, garbage collection, and other operations may be tracked for endurance, reliability, and failure prediction for media devices 140.

FIG. 3 is a block diagram illustrating example offloaded services, peer communications, and error detection and recovery handled by storage device 120.1 and its peer storage devices 120, in accordance with some embodiments. Storage device 120.1 includes CPU 302 for executing modules, programs, and/or instructions stored in memory 320 and thereby performing processing operations, memory 320 (sometimes called NVM controller memory, device controller memory, or operating memory), and one or more communication buses 300 for interconnecting these components.

The one or more communication buses 300 optionally include circuitry (sometimes called a chipset) that interconnects and controls communications between system components. CPU 302 and memory 320 may be coupled to interconnect fabric interface 301, RDMA interface 304, remotely addressable memory 306, media interface 308, erasure coding engine 310, media devices 140.1, and any additional module(s) by the one or more communication buses 300. In some embodiments, interface hardware and/or protocols for providing communication through communication buses 300 may also be present for communication with any given component.

Memory 320 may include high-speed random access memory, such as DRAM, SRAM, DDR RAM, or other random access solid state memory devices, and may include non-volatile memory, such as one or more magnetic disk storage devices, optical disk storage devices, flash memory devices, or other non-volatile solid state storage devices. Memory 320 may optionally include one or more storage devices remotely located from CPU 302. In some embodiments, one or more additional memories may be provided for specific functions, such as an FTL memory for flash translation layer (FTL) data, and/or remotely addressable memory 306. These functional memories may include specialized processing, hardware acceleration, and/or other resources related to their function. In some embodiments, remotely addressable memory 306 may be part of memory 320.

Memory 320, or alternatively the non-volatile memory device(s) within memory 320, comprises a non-transitory computer readable storage medium. In some embodiments, memory 320, or the non-transitory computer readable storage medium of memory 320 stores the following programs, modules, and data structures, or a subset or superset thereof:
- offloaded services 322 for providing distributed storage management across peer storage devices, including storage device 120.1;
- media manager 324 for managing storage device FTL data (including logical address mapping) and related processes and requests, such as media read and write operations through media interface 308 to media devices 140.1.1-140.1.n;
- peer communication module 326 for communicating command messages and data transfers between storage devices 120 through interconnect fabric interface 301, sometimes using access to remotely addressable memory 306, without the intervention of host 102, storage controller 110, or similarly distinct storage control plane systems;
- peer device registry 328 for identifying the peer storage device identifiers of peer storage devices and/or storing other data management and/or peer services information related to each other storage device;

device error detector 330 for detecting and/or predicting data errors in media devices 140.1.1-140.1.n; and self-healing module 332 for recovering failed data units from peer recovery data and storing them to media devices 140.1.1-140.1.n and/or offloading them to a peer storage device.

Each of the above identified elements may be stored in one or more of the previously mentioned memory devices that together form memory 320 and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 320 may store a subset of the modules and data structures identified above. Furthermore, memory 320 may store additional modules and data structures not described above. In some embodiments, the programs, modules, and data structures stored in memory 320, or the non-transitory computer readable storage medium of memory 320, provide instructions for implementing respective operations of the methods described below. In some embodiments, some or all of these modules may be implemented with specialized hardware circuits that subsume part or all of the module functionality.

In some embodiments, offloaded services 322 may provide message handling, processing logic, and/or data structures for one or more data management services that may have otherwise been managed by a host controller, storage controller, RAID controller, or other storage control plane system. In some embodiments, a storage control plane device may still have a role in configuring and/or initiating offloaded services 322. For example, a RAID controller may be used for an initial configuration of RAID parameters and provide a common data structure of those parameters for use by storage device 120.1 and its peer storage devices, but the actual allocation and maintenance of RAID stripes for incoming host writes may be managed by offloaded services 322 and related peer communication. Some example offloaded services 322 may include host FTL management 322.1, data parity management 322.2, RAID strip management 322.3, data mirroring management 322.4, and data scrub management 322.5.

In some embodiments, host FTL management 322.1 may provide distributed management of host FTL mapping information. For example, a global host FTL data structure may be segmented and divided among peer storage devices to enable the table size to scale with the number of storage devices. Host FTL service commands may be issued by storage devices and/or storage control plane systems and received by host FTL management 322.1 of the storage device that contains the relevant segment of the host FTL data structure. In some embodiments, host FTL management 322.1 may include commands and related services for allocating, querying, and updating the local host FTL data structure.

In some embodiments, data parity management 322.2 may provide distributed management of the calculation and storage of parity data. For example, host data stored in a peer group may be configured according to a RAID configuration using parity data. Data parity commands may be issued by storage devices and/or storage control plane systems and received by data parity management 322.2 to process data units through erasure coding engine 310 for encoding or decoding parity. In some embodiments, remotely addressable memory 306 may be used to receive, decode/encode, and store resulting calculations for transfer to another storage device or media devices 140.1. In some embodiments, data parity management 322.2 may include commands and related services for receiving, decoding/encoding, storing, and updating related storage location information.

In some embodiments, RAID stripe management 322.3 may provide distributed management of the configuration, allocation, and updating of RAID stripe information for one or more RAID groups supported by the peer group. For example, a RAID stripe configuration (stripe depth, RAID group, storage location selection logic, etc.) and RAID stripe mapping information (to locate specific strips and data recovery dependencies) may be distributed across a peer group. RAID stripe commands may be issued by storage devices and/or storage control plane systems and received by RAID stripe management 322.3 to configure and access RAID stripe information. In some embodiments, RAID stripe management 322.3 may calculate the distribution of host data writes and parity calculation and storage for each RAID stripe it is configured to manage and respond to queries when striped host data needs to be modified or recovered. In some embodiments, RAID stripe management 322.3 may include commands and related services for receiving and updating RAID configurations and supporting logic and data structures, as well as responding to queries related to allocating and/or locating RAID strips and data recovery dependencies.

In some embodiments, data mirroring management 322.4 may provide distributed management of the configuration, allocation, and updating of host data mirrored to multiple storage devices. For example, a RAID configuration may include mirroring of host data among two or more peer storage devices. Data mirroring commands may be issued by storage devices and/or storage control plane systems and received by data mirroring management 322.4 to configure and access data mirror information. In some embodiments, data mirroring management 322.4 may calculate the distribution of redundant host data writes for host data written to that storage device or as a service to other storage devices. In some embodiments, data mirroring management 322.4 may include commands and related services for receiving and updating data mirroring configurations and supporting logic and data structures, as well as responding to queries related to allocating and/or locating mirror copies for data recovery.

In some embodiments, data scrub management 322.5 may provide distributed management of the configuration, allocation, and data collection from media data scrubs. For example, data scrub management 322.5 may include logic for systematically assigning and prioritizing data scrub tasks among peer storage devices, as well as tracking when media locations have last been scrubbed. Data scrub commands may be issued by storage devices and/or storage control plane systems and received by data scrub management 322.5 to configure data scrub targets, schedules, and patterns and to receive and respond to data scrub commands. For example, data scrub management 322.5 may identify when a particular media segment is due for scrubbing, issue related data scrub commands, and track completion and any reported errors. In some embodiments, data scrub management 322.5 may include commands and related services for receiving and updating data scrub configurations and supporting logic and data structures, as well as sending and receiving commands for initiating data scrubs, tracking data scrub progress, and reporting results.

In some embodiments, media manager 324 manages access to and maintenance of media devices 140.1. For example, media manager 324 may include base FTL services for storage device 120 and manages the storage device FTL map, as well as read, write, and data management access to media devices 140. Host commands involving host data reads, writes, erases, etc. may be directed by media manager 324 through media interface 308 for accessing media devices 140.1. In some embodiments, host data commands may be pre-processed by other modules, such as offloaded services 322, and related internal data access commands may be received by media manager 324. In some embodiments, storage device FTL provides a base level of FTL mapping for storage device 120. Storage device FTL may include allocation of storage locations with a defined size based on compatibility of with storage units in media devices 140.1, such as page size. For example, storage locations may be allocated as 4 KB or 8 KB pages. In some embodiments, allocation sizes for storage locations may correspond to larger multiplane NVM page sizes, such as 96 KB.

Media manager 324 may be responsible for bad block management, bad block spare overprovisioning, and allocation of gap free logical space throughout the life of the media devices 140.1. In some embodiments, media manager 324 may also include error correction (e.g., low-density parity-check (LDPC) or Bose-Chaudhuri-Hocquenghem (BCH) codes) supported by an error correction engine and tuning of NVM access parameter (e.g., read levels, programming thresholds, etc.). Media manager 324 may enable reads from logical block address (LBA) storage locations in media devices 140 to write in remotely addressable memory 306 and reads from remotely addressable memory 306 to writes in LBA storage locations in media devices 140.1. In some embodiments, media manager 324 may manage data reads and writes to/from media devices 140.1 to support offloaded services 322, device error detector 330, and/or self-healing module 332.

In some embodiments, peer communication module 326 may provide communication among storage devices 120 using interconnect fabric 114 without being routed through storage controller 110 or another host, controller, or storage control plane component. For example, peer communication module 326 may enable drive-to-drive messaging addressed by storage device identifiers, peer-drive broadcasts that provide the same message to all peer storage devices, and/or access to shared memory locations, such as remotely addressable memory 306 for direct data transfer and/or access of host and parity data, data management logs, etc. In some embodiments, packetized messages may be routed among storage devices 120.1 using one or more network communication protocols compatible with interconnect fabric 114 and/or network fabric 104.

In some embodiments, peer communication module 326 operates in conjunction with RDMA interface 304 to manage local and remote use of remotely addressable memory 306. For example, local operations by media manager 324 may include writes and reads to remotely addressable memory 306, read/write operations may include coordinated use of space in remotely addressable memory 306 for both local and remote access, and other distributed operations may use space in remotely addressable memory 306 as requested by storage controller 110 or other storage devices.

In some embodiments, peer device registry 328 may be a data structure for maintaining information regarding each other peer storage device in a peer group, such as storage devices 120 in peer group 106. For example, peer device registry 328 may be a table, list, array, database, or similar data structure for storing storage device identifiers 328.1, other addressing information, peer parity bonds 328.2, peer mirror bonds 328.3, and/or additional information on peer storage devices, such as specifications and/or parameters of the storage devices. In some embodiments, storage device identifier 328.1 may include or translate into a network compatible device address for routing data frames from storage device 120.1 to a selected peer storage device.

In some embodiments, peer device registry 328 may include storage device identifiers 328.1 for each storage device corresponding to a peer group shared with storage device 120.1. For example, storage device 120.1 may belong to peer group A and each other storage device 120 in peer group A may have an entry in peer device registry 328 with a storage device identifier 328.1 for addressing peer communications. For example, each storage device may have an entry (e.g. a row in a table) with a key (e.g. storage device identifier) and a field (e.g. column in a table) for one or more peer group identifiers.

In some embodiments, peer device registry 328 may identify peer storage devices that include parity bonds 328.2 and/or mirror bonds 328.3 and may contain recovery data relevant to host data stored in storage device 120.1. For example, one or more devices in peer group 106 may participate in a RAID group and contain RAID stripe data (parity data and/or corresponding paired host data) and peer parity bonds 328.2 may identify which peer storage devices are in the RAID group. One or more devices in peer group 106 may be mirroring some or all host data stored in storage device 120.1 and peer mirror bonds 328.3 may identify which storage devices contain duplicate data for storage device 120.1.

In some embodiments, peer parity bonds 328.2 and/or peer mirror bonds 328.3 may indicate the parity bond and/or mirror bond relationship and may use a peer command and offloaded service, such as data parity management 322.2, RAID stripe management 322.2, and/or data scrub management 322.5 on the bonded peer storage device or another peer storage device, to query for specific parity data or host data. For example, when a data unit has failed, the host LBA(s) of the failed units may be included in a peer query command to one or more of the corresponding peer storage devices identified in peer parity bonds 328.2 and/or peer mirror bonds 328.3 and each storage device queried may return a response acknowledging whether it has the relevant data and the storage location for retrieving it. A peer storage device indicated as having at least one of peer parity bonds 328.2 may be a peer parity storage device. A peer storage device indicated as having at least one of peer mirror bonds 328.2 may be a peer mirror storage device.

In some embodiments, peer parity bonds 328.2 and/or peer mirror bonds 328.3 may include or reference a local data structure and/or provide logic for specifically mapping a failed host data unit to its recovery data on one or more peer storage devices. For example, when a data unit has failed, the host LBA(s) of the failed units may be used to index peer parity bonds 328.2 and/or peer mirror bonds 328.3 and identify the specific device and/or storage location of the desired recovery data. Self-healing module 332 may then initiate the relevant data transfers to receive the identified recovery data.

In some embodiments, storage device 120.1 may include a device error detector 330 for identifying and/or predicting partial and/or complete failures of data units. For example, device error detector 330 may be configured to detect host block, line, page, erase block, and/or media device read and/or write errors. In some embodiments, these data errors may include recoverable data errors where retries, error correction, and/or other techniques enable reconstruction of the data unit solely from local host data and/or other local resources. These data errors may include unrecoverable errors where retries, error correction, and/or other techniques using local host data and/or local compute resources within storage device 120.1 may be insufficient to recover the data.

Device error detector 330 may identify and classify a data unit as "failed" based on whether external recovery data (e.g. recovery data from a peer storage device) is needed to reliably reconstruct and relocate the failed data unit. In some embodiments, device error detector 330 may also identify and classify data units as "failed" even if able to locally recover contents of the data unit but with a significant probability that the recovery may not be repeatable and/or may trigger a more permanent or extensive failure. For example, an error rate, recovery protocol, endurance data, or composite thereof may define a failure threshold for a data unit regardless of whether the data unit was ultimately reconstructed from local data. A failed data unit may also be an indicator that a storage location is failing. In some embodiments, a storage location where a failure threshold has been reached may indicate a failing media location.

In some embodiments, device error detector 330 may include one or more methods for detecting media device errors in media devices 140.1. For example, device error detector 330 may use read/write errors 330.1, endurance thresholds 330.2, and/or media/data scans 330.3. Read/write errors 330.1 may include data read errors and/or data write errors that occur during host data read/write operations. For example, host read commands and host write commands processed through media manager 324 may generate errors due to flawed or degraded storage media 140.1 and storage locations thereon. Read/write errors 330.1 may also be generated during data management activities that include host data reads or writes, such as garbage collection, wear levelling, data offloading, parity read/writes, etc.

Endurance thresholds 330.2 may include one or more endurance-related metrics managed by storage device 120.1. For example, storage device 120.1 may track reads and writes to specific storage locations against expected read/write thresholds for a particular media device. In some embodiments, endurance thresholds 330.2 may include monitoring other metrics related to read/write and/or device performance, such as error rates, voltage thresholds, and other parameters. In some embodiments, a data unit or storage location may be designated as failed based on exceeding an endurance threshold value suggestive of imminent failure, generally within a margin of expected reads or writes.

Media/data scans 330.3 may include periodic and/or event-based scans of storage media 140.1 or portions thereof using media read and/or media writes. For example, based on a data scrub schedule and pattern, pages and/or erase blocks may be read from one storage location into another storage location to allow error correction to fix bit errors and/or identify storage locations and/or data units therein that cannot be recovered through the error correction algorithms of storage device 120.1. Unrecoverable storage locations and/or data units may be designated as failed. In some embodiments, storage locations and/or data units requiring a certain threshold level of ECC correction to recover the host data may be designated as failed. In some embodiments, storage device 120.1 may include self-scans based on media read/write history, a scheduled data scan pattern, and/or a round-robin data scan responsive to available compute and/or buffer capacity. In some embodiments, media/data scans 330.3 are administered by media manager 324 as part of device FTL management. In some embodiments, media/data scans 330.3 may be responsive to host or offloaded services, such as data scrub management 322.5.

In some embodiments, storage device 120.1 may include a self-healing module 332 for recovering and relocating failed data units from a failed or failing storage location to another storage location. For example, self-healing module 332 may identify a failed data unit based on device error detector 330, identify recovery data needed from a peer storage device based in peer device registry 328, request the recovery data from the peer storage device, and receive and write the recovery data and/or recoverable data from the failed data unit to a new storage location in media devices 140.1. Self-healing module 332 may operate in conjunction with media manager 324 to read any data that can be recovered from the failed storage location, transfer recovery data received from peer storage devices, and write the recovered data unit (which may include both locally recovered data and transferred recovery data) to the new storage location in media devices 140.1. In some embodiments, media manager 324 may select the new storage location and update related mapping information as part of device FTL management.

In some embodiments, a failed data unit may correspond to a RAID stripe or other storage configuration that includes parity-based data recovery (or another erasure encoding method). Self-healing module 332 may include parity rebuild 332.1 for requesting recovery data based on parity reconstruction of some or all of the failed data unit. For example, parity rebuild 332.1 may use peer parity bonds 328.2 to identify the peer storage devices that include corresponding parity data and/or the second set of host data used to erasure encode the failed data unit. In some embodiments, parity rebuild 332.1 may request the rebuilt host data from a peer storage device that stores at least one of the parity data or second set of host data and the peer storage device executes the erasure coding operation (XOR) to rebuild the missing data. In some embodiments, parity rebuild 332.1 may request the parity data and the second set of host data as recovery data and execute the rebuild of the host data locally.

In some embodiments, a failed data unit may correspond to a mirrored data configuration where one or more duplicate copies of the host data are maintained on other storage devices. Self-healing module 332 may include mirror recovery 332.2 for requesting the copy of the failed data unit or a portion thereof from one or more peer storage devices. In some embodiments, self-healing module 332 may use peer mirror bonds 328.3 to identify one or more peer storage devices that store mirrored host data corresponding to the failed data unit. In some embodiments, mirror recovery 332.2 may send one or more peer data transfer commands to peer storage devices to retrieve and use the mirrored data as recovery data.

In some embodiments, self-healing module 332 may recover the failed data unit to a peer storage device instead of storage media 140.1. For example, self-healing module 332 in operation with media manager 324 may identify that no suitable storage locations remain in media devices 140.1 and the recovered host data should be offloaded to another storage device or peer offload storage device. Self-healing module 332 may include data offload 332.3 for communicating with one or more peer storage devices to identify a new storage location for the recovered data. For example, data offload 332.3 may query one or more peer storage devices in the peer group to locate available capacity and then use a peer data transfer command to move the recovered data to the new storage location. In some embodiments, data offload 332.3 may use peer device registry 328 to identify peer storage devices, send one or more queries regarding available capacity, and use remotely addressable memory 306 to transfer the recovered data to a new storage location. For example, when recovery data is received and the failed storage unit is recovered or rebuild, it may be written to remotely addressable memory 306 and a peer data transfer command may be sent to a peer storage device to access remotely addressable memory 306 and write the recovered data unit to a storage location in the peer storage device's media devices.

Figure 4:
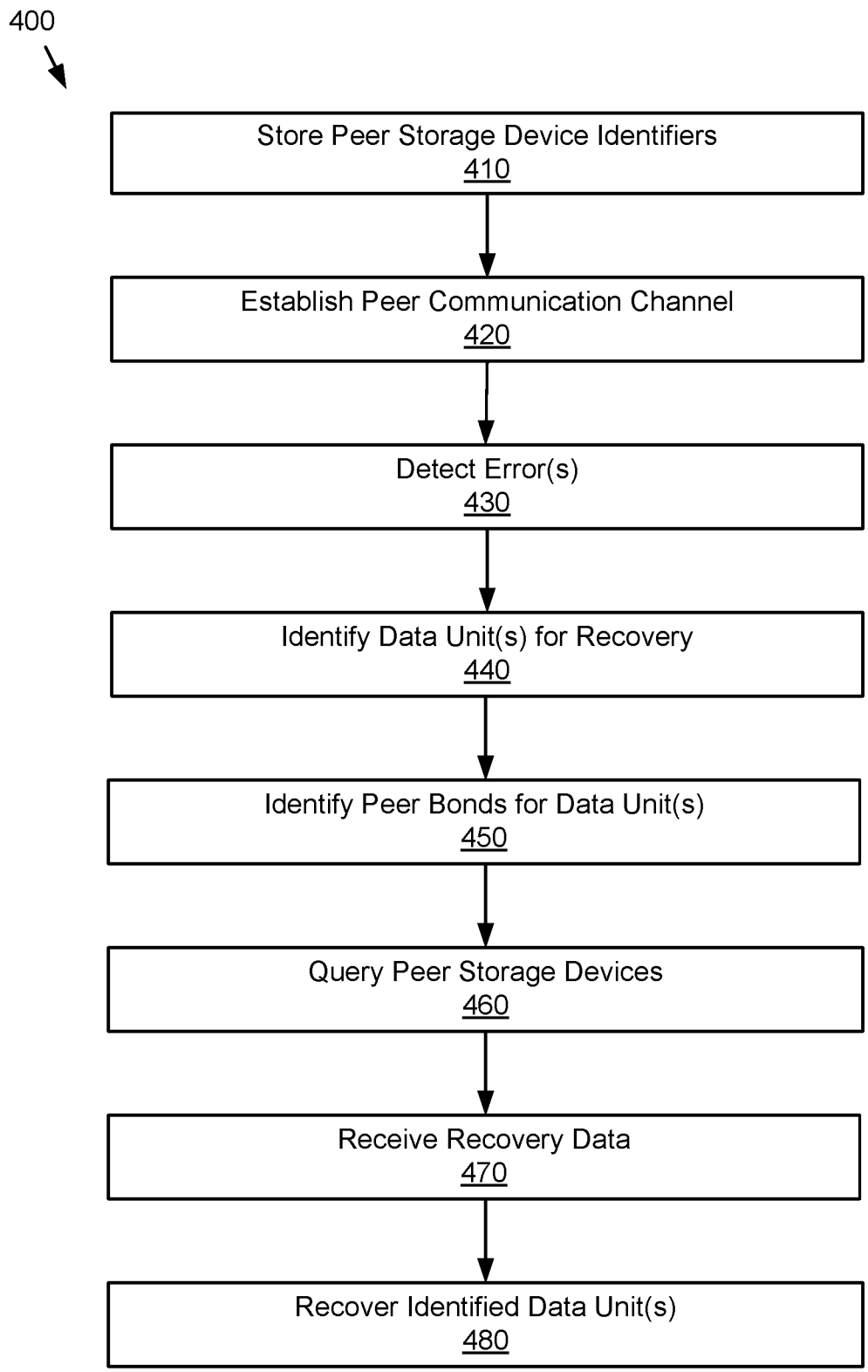
FIG. 4 illustrates an example of a method for using peer data recovery for a storage device.

As shown in FIG. 4, storage device 120.1 operating within data storage system 100 may be operated among peer data storage devices 120 to recover host data for a failed data unit. For example, storage device 120.1 may initiate self-healing operations with one or more peer storage devices (e.g. storage devices 120) and recover a failed data unit according to the method 400 illustrated by blocks 410-480 of FIG. 4.

At block 410, peer storage device indicators are stored for at least one peer group. For example, a storage device may include a peer storage device registry that contains peer storage device indicators for at least every other storage device in that storage device's peer group or peer groups. The peer storage device indicators may enable peer-to-peer communications to be addressed and routed between the peer storage devices.

At block 420, at least one peer communication channel between an initiating storage device and a peer storage device is established. For example, the peer storage devices in a peer group may be connected by a common interconnect fabric and/or network fabric that enables each peer storage device to address and send data frames (messages and/or data transfer) to each other peer storage device. In some embodiments, a peer communication channel for packetized messages over network protocols may be established among the peer group upon startup and/or configuration of the peer storage devices and/or peer group and a second peer communication channel for data transfer (such as between remotely addressable memories) may be established as needed for specific peer operations. In some embodiments, a peer communication channel may be established via a network handshake process where the two (or more) peer storage devices agree that they are available for and initiating a peer operation.

At block 430, an error is detected in one or more data units in the storage media of one of the peer storage devices. For example, in response to a failed or failing read or write operation, storage location endurance metrics, and/or errors detected in a media or data scan, a data error may be detected for a particular storage location.

At block 440, one or more failed data units may be identified for data recovery. For example, a detected error may be localized to a specific data unit and/or impact several data units and corresponding storage location. In some embodiments, the failed data unit may be identified by one or more host LBAs in need of data recovery.

At block 450, one or more peer storage devices with data recovery peer bonds may be identified. For example, a peer device registry may identify one or more storage devices having parity data peer bonds or mirror data peer bonds with recovery data corresponding to the failed data units.

At block 460, one or more storage devices are queried for the corresponding recovery data. For example, the storage device with the failed data unit may send one or more peer data query commands to identify, locate, and/or initiate a transfer of the recovery data. In some embodiments, the storage device may be configured to specifically address the peer storage device containing the relevant recovery data by host LBA or may query a plurality of peer storage devices to determine which peer storage device contains and can transfer the corresponding recovery data.

At block 470, the recovery data may be received from the peer storage device or devices. For example, mirror data and/or parity data for rebuilding the failed data unit may be received in response to one or more of the queries in block 460.

At block 480, the failed data units may be recovered using the recovery data received from the peer storage devices. For example, mirrored data may be stored to replace some or all of the failed data unit and/or parity data may be used to rebuild some or all of the failed data unit. In some embodiments, a writable storage location (e.g. erase block) may correspond to the failed data unit as well as additional data units that are recoverable and/or multiple methods of recovery may need to be used (e.g. mirror data and parity calculated data) and these various data sources may be assembled into the recovered data unit for the new storage location.

Figure 5:
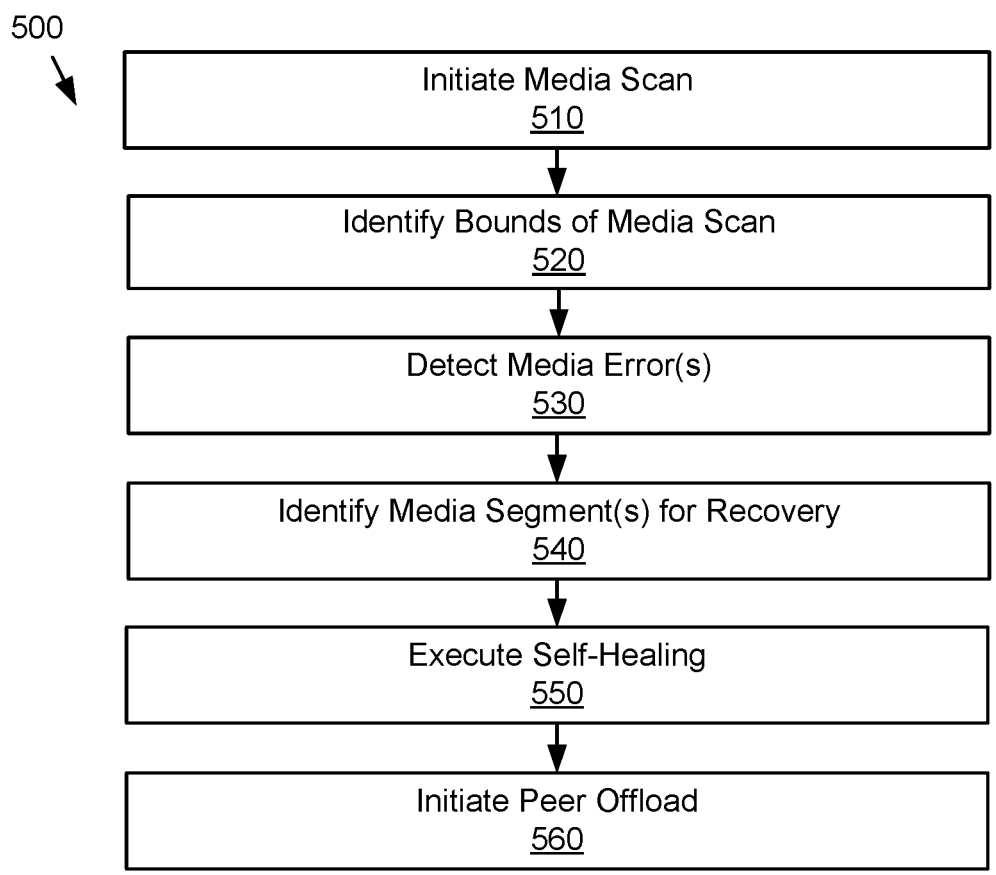
FIG. 5 illustrates an example of a method for a media scan to initiate peer data recovery using a storage device.

As shown in FIG. 5, storage device 120.1 operating within data storage system 100 may be operated according to a media scan to support self-healing and optional peer offload in the event that local storage devices are nearing capacity or end of life. For example, storage device 120.1 may initiate self-maintenance and self-healing according to the method 500 illustrated by blocks 510-560 of FIG. 5.

At block 510, a media scan is initiated. For example, a storage device may receive a host or peer data management command to initiate a media scan, the storage device may include a schedule for media scans, and/or there may be event-based triggers for the media scan.

At block 520, the bounds of the media scan may be identified. For example, a media scan operation may relate to a specific data unit or group of data units based on logical or physical addresses. In some embodiments, the bounds of the media scan may be included as parameters of a data management command, self-scanning schedule, or event-based trigger.

At block 530, one or more media errors may be identified during the media scan. For example, the media scan may identify on or more data units including errors in excess of an error threshold, such as the ECC correction capability of the storage device.

At block 540, one or more failed data units in a media segment containing data errors may be identified for data recovery. For example, a detected error may be localized to a specific data unit and/or impact several data units and corresponding media storage location. In some embodiments, the failed data unit may be identified by one or more host LBAs in need of data recovery that correspond to a media segment.

At block 550, self-healing may be executed to recover the data from the failed data units. For example, a self-healing process similar to method 400 in FIG. 4 may be used to recover the identified data units and rebuild the media segment.

At block 560, a peer offload may be initiated for at least the recovered media segment. For example, the storage device may identify a storage location on a peer storage device to receive the recovered media segment in response to not finding a new storage location meeting capacity, risk, and/or endurance requirements for the recovered data locally.

While at least one exemplary embodiment has been presented in the foregoing detailed description of the technology, it should be appreciated that a vast number of variations may exist. It should also be appreciated that an exemplary embodiment or exemplary embodiments are examples, and are not intended to limit the scope, applicability, or configuration of the technology in any way. Rather, the foregoing detailed description will provide those skilled in the art with a convenient road map for implementing an exemplary embodiment of the technology, it being understood that various modifications may be made in a function and/or arrangement of elements described in an exemplary embodiment without departing from the scope of the technology, as set forth in the appended claims and their legal equivalents.

As will be appreciated by one of ordinary skill in the art, various aspects of the present technology may be embodied as a system, method, or computer program product. Accordingly, some aspects of the present technology may take the form of an entirely hardware embodiment, an entirely software embodiment (including firmware, resident software, micro-code, etc.), or a combination of hardware and software aspects that may all generally be referred to herein as a circuit, module, system, and/or network. Furthermore, various aspects of the present technology may take the form of a computer program product embodied in one or more computer-readable mediums including computer-readable program code embodied thereon.

Any combination of one or more computer-readable mediums may be utilized. A computer-readable medium may be a computer-readable signal medium or a physical computer-readable storage medium. A physical computer readable storage medium may be, for example, but not limited to, an electronic, magnetic, optical, crystal, polymer, electromagnetic, infrared, or semiconductor system, apparatus, or device, etc., or any suitable combination of the foregoing. Non-limiting examples of a physical computer-readable storage medium may include, but are not limited to, an electrical connection including one or more wires, a portable computer diskette, a hard disk, random access memory (RAM), read-only memory (ROM), an erasable programmable read-only memory (EPROM), an electrically erasable programmable read-only memory (EEPROM), a Flash memory, an optical fiber, a compact disk read-only memory (CD-ROM), an optical processor, a magnetic processor, etc., or any suitable combination of the foregoing. In the context of this document, a computer-readable storage medium may be any tangible medium that can contain or store a program or data for use by or in connection with an instruction execution system, apparatus, and/or device.

Computer code embodied on a computer-readable medium may be transmitted using any appropriate medium, including but not limited to, wireless, wired, optical fiber cable, radio frequency (RF), etc., or any suitable combination of the foregoing. Computer code for carrying out operations for aspects of the present technology may be written in any static language, such as the C programming language or other similar programming language. The computer code may execute entirely on a user's computing device, partly on a user's computing device, as a stand-alone software package, partly on a user's computing device and partly on a remote computing device, or entirely on the remote computing device or a server. In the latter scenario, a remote computing device may be connected to a user's computing device through any type of network, or communication system, including, but not limited to, a local area network (LAN) or a wide area network (WAN), Converged Network, or the connection may be made to an external computer (e.g. through the Internet using an Internet Service Provider).

Various aspects of the present technology may be described above with reference to flowchart illustrations and/or block diagrams of methods, apparatus, systems, and computer program products. It will be understood that each block of a flowchart illustration and/or a block diagram, and combinations of blocks in a flowchart illustration and/or block diagram, can be implemented by computer program instructions. These computer program instructions may be provided to a processing device (processor) of a general purpose computer, special purpose computer, or other programmable data processing apparatus to produce a machine, such that the instructions, which can execute via the processing device or other programmable data processing apparatus, create means for implementing the operations/acts specified in a flowchart and/or block(s) of a block diagram.

Some computer program instructions may also be stored in a computer-readable medium that can direct a computer, other programmable data processing apparatus, or other device(s) to operate in a particular manner, such that the instructions stored in a computer-readable medium to produce an article of manufacture including instructions that implement the operation/act specified in a flowchart and/or block(s) of a block diagram. Some computer program instructions may also be loaded onto a computing device, other programmable data processing apparatus, or other device(s) to cause a series of operational steps to be performed on the computing device, other programmable apparatus or other device(s) to produce a computer-implemented process such that the instructions executed by the computer or other programmable apparatus provide one or more processes for implementing the operation(s)/act(s) specified in a flowchart and/or block(s) of a block diagram.

A flowchart and/or block diagram in the above figures may illustrate an architecture, functionality, and/or operation of possible implementations of apparatus, systems, methods, and/or computer program products according to various aspects of the present technology. In this regard, a block in a flowchart or block diagram may represent a module, segment, or portion of code, which may comprise one or more executable instructions for implementing one or more specified logical functions. It should also be noted that, in some alternative aspects, some functions noted in a block may occur out of an order noted in the figures. For example, two blocks shown in succession may, in fact, be executed substantially concurrently, or blocks may at times be executed in a reverse order, depending upon the operations involved. It will also be noted that a block of a block diagram and/or flowchart illustration or a combination of blocks in a block diagram and/or flowchart illustration, can be implemented by special purpose hardware-based systems that may perform one or more specified operations or acts, or combinations of special purpose hardware and computer instructions.

While one or more aspects of the present technology have been illustrated and discussed in detail, one of ordinary skill in the art will appreciate that modifications and/or adaptations to the various aspects may be made without departing from the scope of the present technology, as set forth in the following claims.

What is claimed is:

1. A storage device, comprising:
   a processor;
   a memory;
   at least one storage medium;

an interface configured to communicate with a plurality of peer storage devices over a peer communication channel, wherein the storage device and each peer storage device of the plurality of peer storage devices are drives; and a self-healing module stored in the memory and executable by the processor to perform operations comprising:

identifying a first storage media segment from the at least one storage medium for recovery to a second storage media segment, wherein the first storage media segment includes a failed data unit;

identifying at least one peer storage device identifier for at least one peer storage device from the plurality of peer storage devices, wherein the at least one peer storage device contains recovery data for the failed data unit;

sending a peer query to the at least one peer storage device over the peer communication channel using the at least one peer storage device identifier;

receiving, responsive to the peer query, the recovery data for the failed data unit from the at least one peer storage device over the peer communication channel; and recovering the first storage media segment to the second storage media segment using the recovery data.

2. The storage device of claim 1, wherein:
the peer communication channel bypasses a storage control plane for managing the storage device; and
the drives are selected from:
  solid-state drives;
  hard disk drives;
  hybrid drives; and
  tape drives.

3. The storage device of claim 1, further comprising:
a device error detector stored in the memory and executable by the processor to perform operations comprising:
  detecting an unrecoverable error in the failed data unit stored on the at least one storage medium; and
  initiating the self-healing module to identify the first storage media segment that includes the failed data unit in response to detecting the unrecoverable error.

4. The storage device of claim 3, wherein the device error detector is further executable by the processor to perform operations comprising:
  detecting a failing media location from the at least one storage medium in response to exceeding an endurance threshold for the failing media location; and
  initiating the self-healing module to identify the first storage media segment, wherein the first storage media segment includes the failing media location and the failing media location includes the failed data unit.

5. The storage device of claim 3, wherein the device error detector is further executable by the processor to perform operations comprising:
  identifying a storage media device from the at least one storage medium, wherein the storage media device includes a plurality of data units; and
  executing a media scan of the storage media device to detect errors in the plurality of data units, wherein the plurality of data units includes the failed data unit and the first storage media segment includes the storage media device.

6. The storage device of claim 3, wherein the device error detector is further executable by the processor to perform operations comprising:

identifying a logical data group from the at least one storage medium, wherein the logical data group includes a plurality of data units; and
executing a media scan of the logical data group to detect errors in the plurality of data units, wherein the plurality of data units includes the failed data unit.

7. The storage device of claim 1, wherein:
the at least one peer storage device includes a peer parity storage device and the recovery data includes a parity data set for the failed data unit; and
recovering the first storage media segment includes using the parity data set to calculate the failed data unit using an erasure coding engine.

8. The storage device of claim 1, wherein:
the at least one peer storage device includes a peer mirror storage device;
the recovery data includes a duplicate data set for the failed data unit; and
recovering the first storage media segment includes using the duplicate data set to write the failed data unit to the second storage media segment.

9. The storage device of claim 1, wherein:
the second storage media segment is in a peer offload storage device selected from the plurality of peer storage devices; and
recovering the first storage media segment to the second storage media segment includes a peer data transfer to the peer offload storage device over the peer communication channel.

10. A computer-implemented method, comprising:
storing storage device identifiers for a plurality of peer storage devices in a first storage device, wherein each peer storage device of the plurality of peer storage devices and the first storage device are drives;
establishing a peer communication channel with at least one peer storage device of the plurality of peer storage devices from the first storage device, wherein the peer communication channel bypasses a storage control plane for managing the first storage device;
identifying a first storage media segment in the first storage device for recovery to a second storage media segment, wherein the first storage media segment includes a failed data unit;
identifying at least one peer storage device identifier for at least one peer storage device from the plurality of peer storage devices, wherein the at least one peer storage device contains recovery data for the failed data unit and is not the first storage device;
sending a peer query to the at least one peer storage device over the peer communication channel using the at least one peer storage device identifier;
receiving, responsive to the peer query, the recovery data for the failed data unit from the at least one peer storage device over the peer communication channel; and
recovering the first storage media segment to the second storage media segment using the recovery data.

11. The computer-implemented method of claim 10, further comprising:
detecting an unrecoverable error in the failed data unit stored in the first storage device, wherein identifying the first storage media segment is in response to detecting the unrecoverable error.

12. The computer-implemented method of claim 10, further comprising:
detecting a failing media location in the first storage device in response to exceeding an endurance threshold for the failing media location, wherein:

identifying the first storage media segment is in response to detecting the failing media location; and the first storage media segment includes the failing media location and the failing media location includes the failed data unit.

13. The computer-implemented method of claim 10, further comprising:

executing a media scan of a storage media device in the first storage device to detect at least one media error, wherein:

the storage media device includes a plurality of data units;

the plurality of data units includes the failed data unit;

the at least one media error relates to the failed data unit;

the first storage media segment includes the storage media device; and identifying the first storage media segment is in response to detecting the at least one media error in the media scan.

14. The computer-implemented method of claim 10, further comprising:

executing a media scan of a logical data group in the first storage device to detect at least one media error in at least one logical data unit, wherein:

the logical data group includes a plurality of logical data units;

the plurality of logical data units includes the failed data unit;

the at least one media error relates to the failed data unit; and identifying the first storage media segment is in response to detecting the at least one media error in the media scan.

15. The computer-implemented method of claim 10, wherein:

the at least one peer storage device includes a peer parity storage device;

the recovery data includes a parity data set for the failed data unit; and recovering the first storage media segment includes using the parity data set to calculate the failed data unit using an erasure coding engine.

16. The computer-implemented method of claim 10, wherein:

the at least one peer storage device includes a peer mirror storage device;

the recovery data includes a duplicate data set for the failed data unit; and recovering the first storage media segment includes using the duplicate data set to write the failed data unit to the second storage media segment.

17. A storage system, comprising:

a plurality of peer storage devices, wherein each peer storage device of the plurality of peer storage devices is a drive that comprises:

at least one storage medium;

means for storing storage device identifiers for the plurality of peer storage devices;

means for establishing a peer communication channel between two of the plurality of peer storage devices, wherein the peer communication channel bypasses a storage control plane for managing the plurality of peer storage devices;

means for identifying a first storage media segment in the at least one storage medium for recovery to a second storage media segment, wherein the first storage media segment includes a failed data unit;

means for identifying at least one peer storage device identifier for at least one recovery peer storage device from the plurality of peer storage devices, wherein the at least one recovery peer storage device contains recovery data for the failed data unit;

means for sending a peer query to the at least one recovery peer storage device over the peer communication channel using the at least one peer storage device identifier;

means for receiving, responsive to the peer query, the recovery data for the failed data unit from the at least one recovery peer storage device over the peer communication channel; and means for recovering the first storage media segment to the second storage media segment using the recovery data.

18. The storage system of claim 17, further comprising:

means for detecting an unrecoverable error in the failed data unit stored in the at least one storage medium, wherein identifying the first storage media segment is in response to detecting the unrecoverable error.

* * * * *